United States Patent
Wu et al.

(10) Patent No.: US 9,263,316 B2
(45) Date of Patent: Feb. 16, 2016

(54) METHOD FOR FORMING A SEMICONDUCTOR DEVICE WITH VOID-FREE SHALLOW TRENCH ISOLATION

(71) Applicant: Taiwan Semiconductor Manufacturing CO., LTD., Hsinchu (TW)

(72) Inventors: Shang-Yen Wu, Tainan (TW); Chiang-Ming Chuang, Changhua (TW); Ping-Pang Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 31 days.

(21) Appl. No.: 14/179,659

(22) Filed: Feb. 13, 2014

(65) Prior Publication Data
US 2015/0228534 A1    Aug. 13, 2015

(51) Int. Cl.
  *H01L 21/8238*   (2006.01)
  *H01L 21/762*    (2006.01)
  *H01L 21/3105*   (2006.01)
  *H01L 21/02*     (2006.01)

(52) U.S. Cl.
  CPC .... *H01L 21/76224* (2013.01); *H01L 21/02274* (2013.01); *H01L 21/31055* (2013.01)

(58) Field of Classification Search
  CPC ............ H01L 21/762; H01L 21/76202; H01L 21/76205; H01L 21/76224; H01L 21/76235
  USPC ................................................. 438/225, 296
  See application file for complete search history.

(56) References Cited

U.S. PATENT DOCUMENTS

2006/0003596 A1 *  1/2006  Fucsko et al. ................. 438/758
2008/0014710 A1 *  1/2008  Bian et al. ..................... 438/424

\* cited by examiner

*Primary Examiner* — Hoai V Pham

(57) ABSTRACT

A semiconductor device is provided. The semiconductor device includes a semiconductor substrate and a trench isolation. The trench isolation is formed in the semiconductor substrate, and includes an isolation oxide and a spin coating material. The isolation oxide is peripherally enclosed by the semiconductor substrate. The spin coating material is peripherally enclosed by the isolation oxide.

18 Claims, 5 Drawing Sheets

METHOD FOR FORMING A SEMICONDUCTOR DEVICE WITH VOID-FREE SHALLOW TRENCH ISOLATION

BACKGROUND

The disclosure relates to a semiconductor device, and more particularly, to a semiconductor device with void-free shallow trench isolation (STI) and a method of forming such semiconductor device.

Generally, shallow trench isolations (STIs) are used to separate and isolate active areas, such as transistors and photo diodes, on a semiconductor wafer from each other. The STIs are formed by etching trenches, forming silicon oxide liners in the trenches, overfilling the trenches with a dielectric material such as an oxide, and then removing any excess dielectric outside the trenches. This dielectric material helps to electrically isolate the active areas from each other. However, due to some factors such as a high deposition rate of dielectric material or a high aspect ratio of the trench, the dielectric material tend collect at top corners of the trench, thus forming overhangs at the top corners of the trench. These overhangs typically grow together faster than the trench is filled with the dielectric material, and a void in the dielectric material filling the trench is created. The void existing in the trench is a critical issue, which may cause acid remaining, worse isolation performance, even semiconductor device function failure, for example.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The making and using of the embodiments are discussed in detail below. It should be appreciated, however, that the disclosure provides many applicable concepts that can be embodied in a wide variety of specific contexts. The specific embodiments discussed are merely illustrative of specific ways to make and use the disclosed subject matter, and do not limit the scope of the different embodiments.

Terms used herein are only used to describe the specific embodiments, which are not used to limit the claims appended herewith. For example, unless limited otherwise, the term "one" or "the" of the single form may also represent the plural form.

Further, spatially relative terms, such as "on," "above" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure are directed to providing a semiconductor device with a void-free trench isolation in which, an isolation oxide first partially fills a trench in a semiconductor substrate, and then a spin coating material with good gap-filling capability fills a remaining portion in the trench to form the trench isolation, thereby preventing a void from being generated in the trench isolation. In addition, after a planarization process is performed, the surface of the trench isolation can be flatter, thus improving the total thickness variation (TTV) of the semiconductor device.

Figure 1:
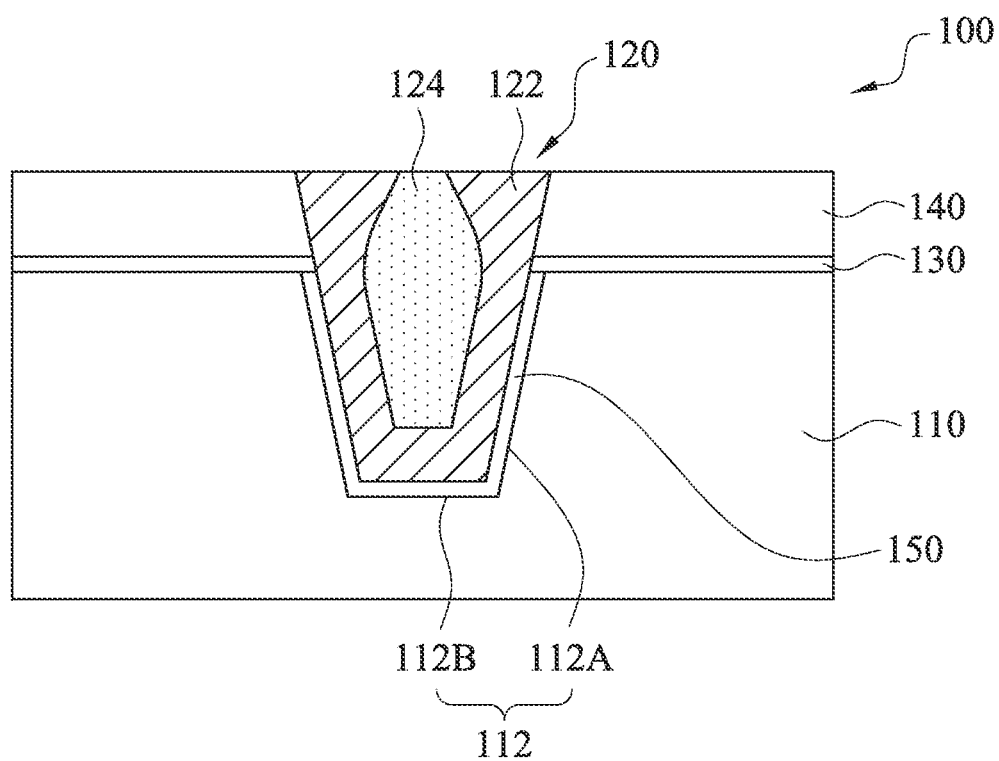
FIG. 1 is a schematic cross-sectional diagram of a semiconductor device in accordance with some embodiments of the disclosure.

Referring to FIG. 1, FIG. 1 illustrates a schematic cross-sectional diagram of a semiconductor device 100 in accordance with some embodiments of the disclosure. The semiconductor device 100 includes a semiconductor substrate 110, a trench isolation 120, a pad layer 130 and a barrier layer 140. The trench isolation 120, such as a shallow trench isolation (STI) or a deep trench isolation, is exemplarily used to separate and isolate photo diodes when the semiconductor device 100 is an image sensor, and is exemplarily used to separate and isolate transistors when the semiconductor device 100 is a logic device. In some embodiments, the semiconductor substrate 110 includes such as silicon, bulk silicon, germanium or diamond. In certain embodiments, the semiconductor substrate 110 may include a compound semiconductor such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. In addition, the semiconductor substrate 110 may be a bulk substrate or a semiconductor-on-insulator (SOI) substrate. The semiconductor substrate 110 has a trench 112 formed by an etching process such as an anisotropic etching process, an isotropic etching process, or another suitable etching process.

The trench isolation 120 is mainly formed by depositing dielectric materials in the trench 112 of the semiconductor substrate 110. In some embodiments, as shown in FIG. 1, a liner layer 150 is disposed over the semiconductor substrate 110 and peripherally enclosed by the semiconductor substrate 110. The liner layer 110 is formed along a sidewall 112A and a floor 112B of the trench 112. In some embodiments, the liner layer 110 is formed by such as a thermal oxidation process, an in-situ steam generation (ISSG) process or a deposition process such as a selective area chemical vapor deposition (SACVD) process, a high aspect ration process (HARP), or the like. In some embodiments, the liner layer 150 may be omitted.

The trench isolation 120 includes an isolation oxide 122 and a spin coating material 124. As shown in FIG. 1, the isolation oxide 122 is peripherally enclosed by the liner layer 150, and the spin coating material 124 is peripherally enclosed by the isolation oxide 122. In some embodiments, the isolation oxide 122 includes such as silicon oxide, silicon dioxide, carbon doped silicon dioxide, nitrogen doped silicon dioxide, germanium doped silicon dioxide, phosphorus doped silicon dioxide, combinations thereof, or the like. In some embodiments, the isolation oxide 122 is deposited by performing a high-density plasma (HDP) chemical vapor deposition (CVD) process. Alternatively, the isolation oxide 122 is deposited by a HARP, a CVD process, a SACVD process, or other suitable process. The spin coating material 124 may include such as cured spin-on glass (SOG), spin-on dielectric (SOD), cured glass resin, combinations thereof, or the like. In some embodiments, the spin coating material 124 is formed first by, such as SOG process, SOD process, or another suitable process, and followed by such as heat a curing process, an ultra-violet (UV) curing process, or another suitable process. With the good gap-filling capability, the spin coating material 124 can substantially or completely fill the trench 112, such that the trench isolation 120 has no or least void formed therein.

In some embodiments, as shown in FIG. 1, the pad layer 130 is disposed over the semiconductor substrate 110, and surrounds the trench isolation 120. The pad layer 130 includes such as silicon oxide. In some embodiments, the pad layer 130 is formed by such as a CVD process, a thermal oxidation process, or another process. The barrier layer 140 is disposed over the pad layer 130, and surrounds the trench isolation 120. The barrier layer 140 includes such as silicon nitride. In some embodiments, the barrier layer 140 is formed by such as a CVD process, a low-pressure chemical vapor deposition (LPCVD) process, a plasma enhanced chemical vapor deposition (PECVD) process, or another suitable process. In certain embodiments, the barrier 140 may be formed directly on the semiconductor substrate 110 without the formation of the pad layer 130. Top surfaces of the isolation oxide 122, the spin coating material 124 and the barrier layer 140 are substantially coplanar to each other. In some embodiments, the isolation oxide 122 and the spin coating material 124 are planarized by performing a planarization process such as a chemical mechanical polishing (CMP) process, a grinding process, or another suitable process.

Figure 2A:
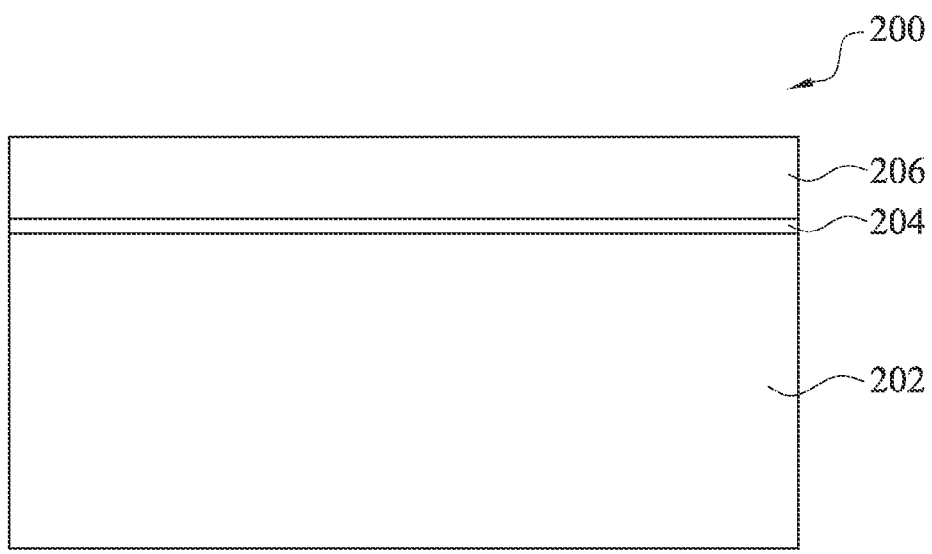
FIG. 2A to FIG. 2F are schematic cross-sectional views of intermediate stages showing a method for fabricating a semiconductor device in accordance with some embodiments of the disclosure.

Referring to FIG. 2A to FIG. 2F, FIG. 2A to FIG. 2F illustrate schematic cross-sectional views of intermediate stages showing a method for fabricating a semiconductor device 200 in accordance with some embodiments of the disclosure. As shown in FIG. 2A, a semiconductor substrate 202 is provided, a pad layer 204 is formed on the semiconductor substrate 202, and a barrier layer 206 is formed on the pad layer 204. In some embodiments, the semiconductor substrate 202 includes such as silicon, bulk silicon, germanium or diamond. In another embodiments, the semiconductor substrate 202 may include a compound semiconductor such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. In addition, the semiconductor substrate 202 may be a bulk substrate or a SOI substrate. The pad layer 204 is formed on the silicon substrate 202. The pad layer 204 includes such as silicon oxide. In some embodiments, the pad layer 204 is formed by such as a CVD process, a thermal oxidation process, or another suitable process. The barrier layer 206 is formed on the pad layer 204. The barrier layer 206 includes such as silicon nitride. In some embodiments, the barrier layer 206 is formed by such as a CVD process, a LPCVD process, a PECVD process, or another suitable process.

Figure 2B:
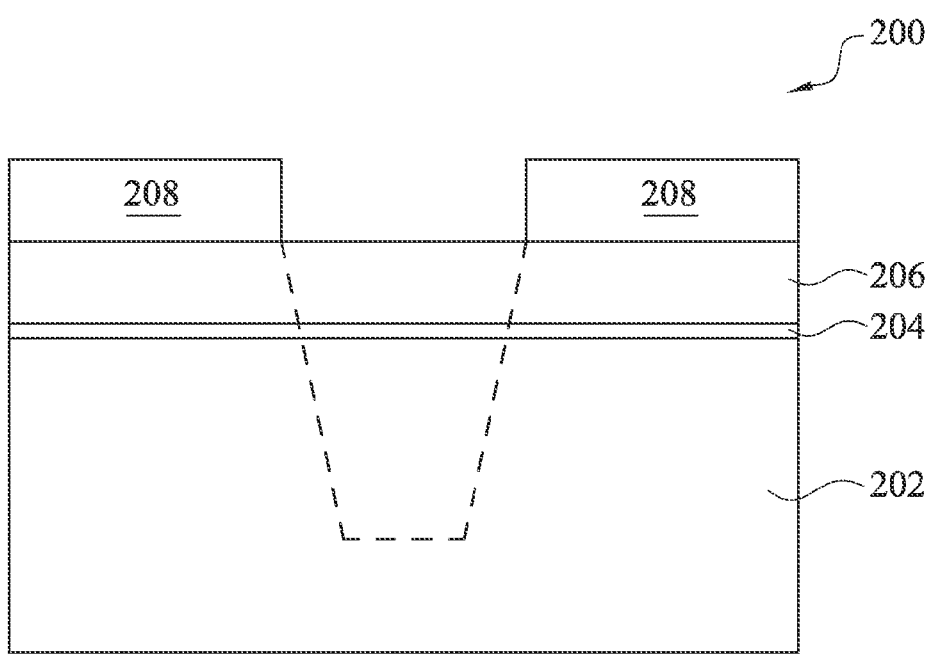
Figure 2C:
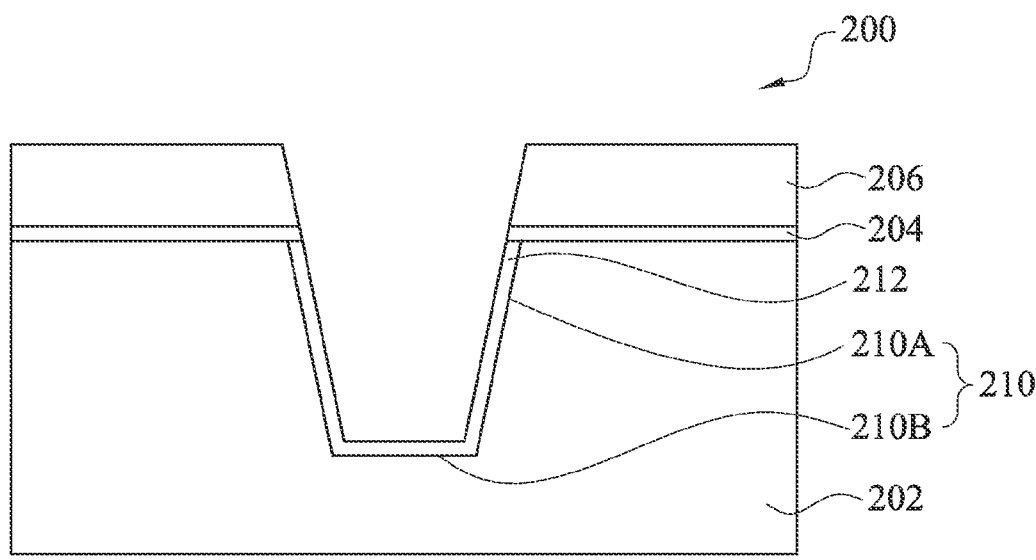

As shown in FIG. 2B, a patterned photoresist layer 208 is formed on the barrier layer 206. Then, an etching process is performed to etch the barrier layer 206, the pad layer 204 and the semiconductor substrate 202 by using the patterned photoresist layer 208 as a mask, so as to form a trench 210 through the pad layer 204, the barrier layer 206 and a portion of the semiconductor substrate 202. In some embodiments, the etching process for forming the trench 210 includes such as an anisotropic etching process, an isotropic etching process, or another suitable etching process. After the etching process, the patterned photoresist layer 208 is stripped. As shown in FIG. 2C, a liner layer 212 is formed along a sidewall 210A and a floor 210B of the trench 210, and is peripherally enclosed by the semiconductor substrate 202. In some embodiments, the liner layer 212 is formed by such as a thermal oxidation process, an ISSG process or a deposition process such as a SACVD process, a HARP, or the like.

Figure 2D:
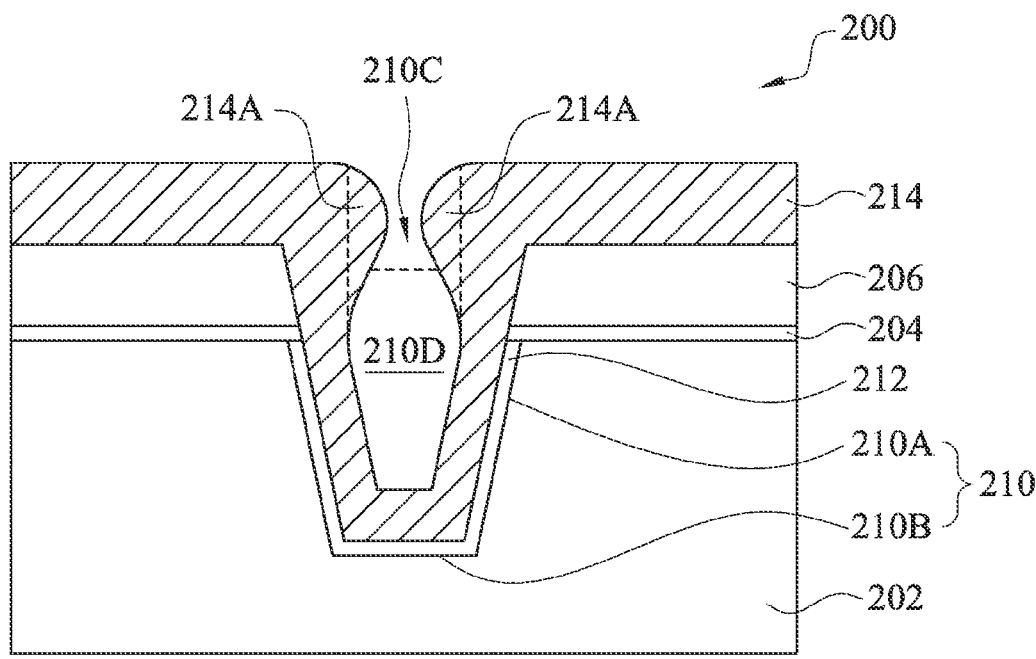

As shown in FIG. 2D, an isolation oxide 214 partially fills the trench 210, and is deposited on the liner layer 212 and the barrier layer 206. The isolation oxide 214 is peripherally enclosed by the liner layer 212, the pad layer 204 and the barrier layer 206. In some embodiments, the isolation oxide 214 includes such as silicon oxide, silicon dioxide, carbon doped silicon dioxide, nitrogen doped silicon dioxide, germanium doped silicon dioxide, phosphorus doped silicon dioxide, combinations thereof, or the like. In some embodiments, the isolation oxide 214 is deposited by such as a HDP CVD process, a HARP, a CVD process, a SACVD process, or another suitable process. After the partial-filling process of the isolation oxide 214, only a portion in the trench 210 is occupied by the isolation oxide 214 and an empty space 210D of the trench 210 remains. In some embodiments, the isolation oxide 214 collected at a top portion of the sidewall 210A of the trench 210 is thicker than that at a bottom portion of the sidewall 210A of the trench 210, i.e. an overhang 214A is formed at a top portion of the trench 210. The overhang 214A shrinks an opening 210C of the isolation oxide 214, and thus the conventional dielectric material cannot be easily deposited into the empty space 210D of the trench 210 through the opening 210C, and thus a void is very likely to exist in the conventional dielectric material filling the trench 210. Therefore, embodiments of the disclosure use a spin coating material with good gap-filling capability to fill the trench 210 instead of the conventional dielectric material.

Figure 2E:
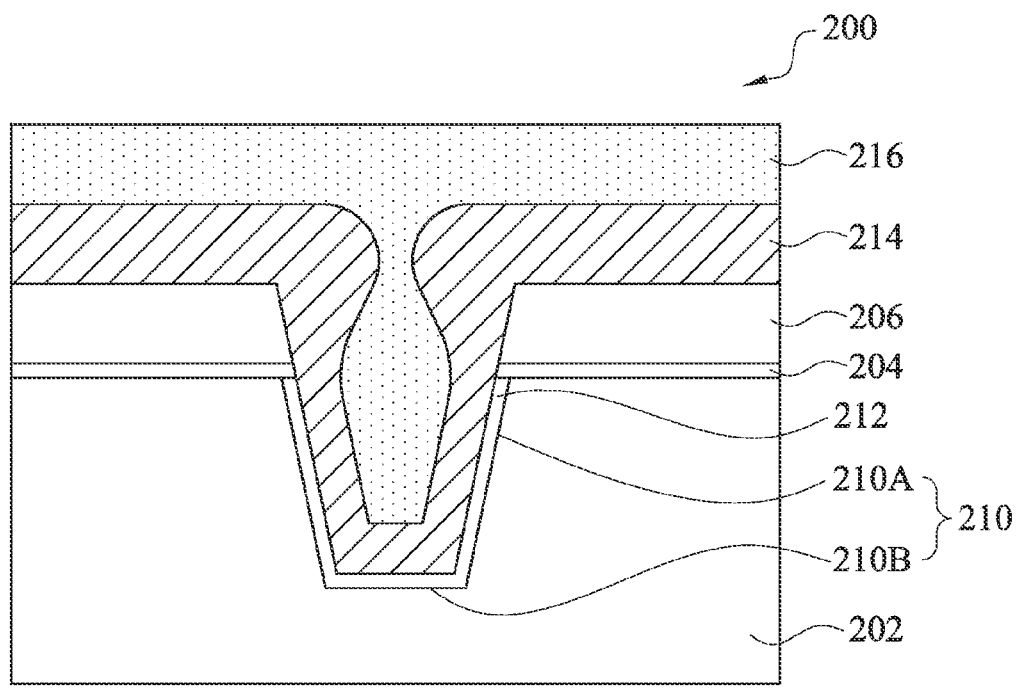

As shown in FIG. 2E, a spin coating material 216 is deposited on the isolation oxide 214 to fill the trench 210. The spin coating material 216 includes such as SOG, SOD, glass resin, combinations thereof, or the like. In some embodiments, the spin coating material 216 is formed by such as a SOG process, a SOD process, or another suitable process. Then, a curing process, such as a heat curing process, a UV curing process, or another suitable process, is performed to cure the spin coating material 216.

Figure 2F:
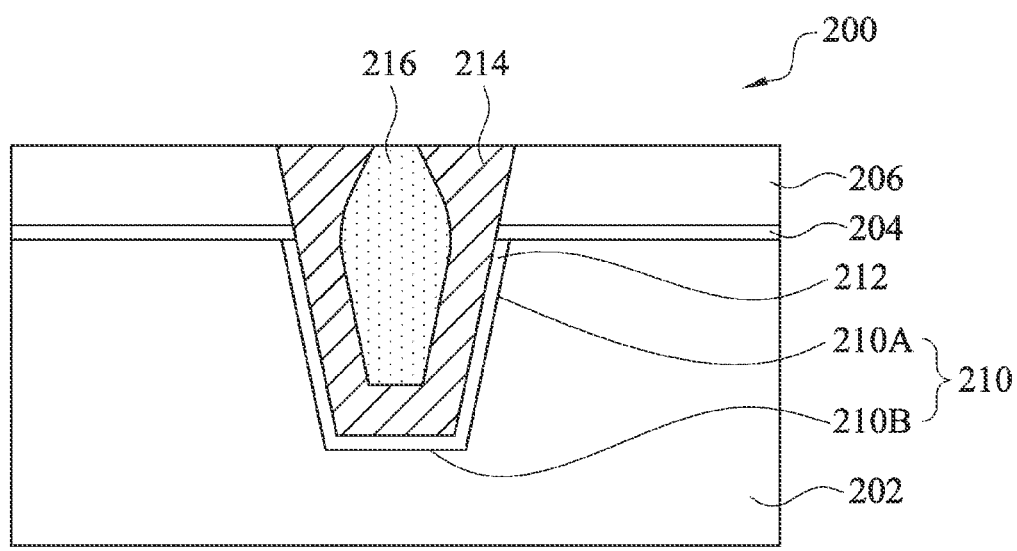

In FIG. 2F, a portion of the isolation oxide 214 and a portion of the spin coating material 216 above a top surface of the barrier layer 206 are removed by a planarization process such as a CMP process, a grinding process, or another suitable process, in which the barrier layer 206 serves as a planarization stop layer for stopping the planarization process. After the planarization process, a portion of the isolation oxide 214 and a portion of the spin coating material 216 remain in the trench 210, and top surfaces of the barrier layer 206, the isolation oxide 214 and the spin coating material 216 are substantially coplanar to each other.

After the planarization process, the semiconductor device 200 with a void-free STI structure is formed, thus resolving the problems such as acid remaining, worse isolation performance, or even semiconductor device function failure caused by the void. In addition, the surface of the semiconductor device after the planarization process becomes flatter, such that TTV of the semiconductor device is improved.

Figure 3:
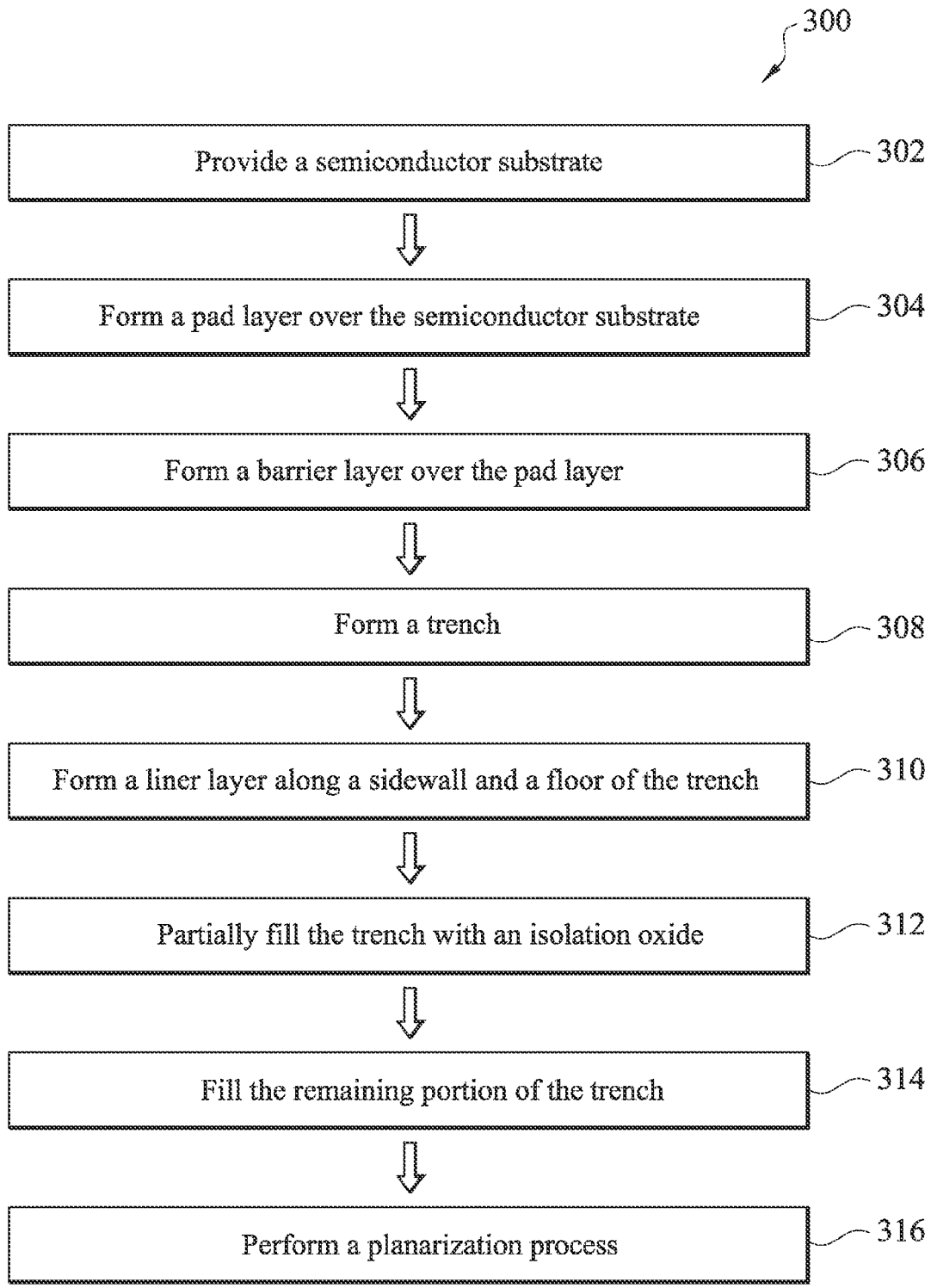
FIG. 3 is a flow chart of a method for fabricating a semiconductor device in accordance with some embodiments of the disclosure.

Referring to FIG. 3 with FIG. 2A to FIG. 2F, FIG. 3 is a flow chart of a method 300 for fabricating a semiconductor device 200 in accordance with some embodiments. The method 300 begins at operation 302, where a semiconductor substrate 202 is provided. In some embodiments, the semiconductor substrate 202 includes such as silicon, bulk silicon, germanium or diamond. In another embodiments, the semiconductor substrate 202 may include a compound semiconductor such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. In addition, the semiconductor substrate 202 may be a bulk substrate or a SOI substrate.

At operation 304, a pad layer 204 is formed on the semiconductor substrate 202. In some embodiments, the pad layer 204 includes such silicon oxide, and is formed by such as a CVD process, a thermal oxidation process, or another suitable process.

At operation 306, a barrier layer 206 is formed on the pad layer 204. In some embodiments, the barrier layer 206 includes such as silicon nitride, and is formed by such as a CVD process, a LPCVD process, a PECVD process, or another suitable process.

At operation 308, a trench 210 is formed through the pad layer 204, the barrier layer 206 and a portion of the semiconductor substrate 202. Then, an etching process is performed to etch the barrier layer 206, the pad layer 204 and the semiconductor substrate 202 by using the patterned photoresist layer 208 as a mask, so as to form a trench 210 through the pad layer 204, the barrier layer 206 and a portion of the semiconductor substrate 202. In some embodiments, the etching process for forming the trench 210 includes such as an anisotropic etching process, an isotropic etching process, or another suitable etching process. After the etching process, the patterned photoresist layer 208 is stripped.

At operation 310, a liner layer 212 is formed along a sidewall 210A and a floor 210B of the trench 210. In some embodiments, the liner layer 212 is formed by such as a thermal oxidation process, an ISSG process or a deposition process such as a SACVD process, a HARP, or the like.

At operation 312, an isolation oxide 214 partially fills the trench 210, and is deposited on the barrier layer 206 and the liner layer 212. In some embodiments, the isolation oxide 214 includes such as silicon oxide, silicon dioxide, carbon doped silicon dioxide, nitrogen doped silicon dioxide, germanium doped silicon dioxide, phosphorus doped silicon dioxide, combinations thereof, or the like. In some embodiments, the isolation oxide 214 is deposited by such as a HDP CVD process, a HARP, a CVD process, a SACVD process, or another suitable process. After operation 312, the isolation oxide 214 is peripherally enclosed by the liner layer 212, the pad layer 204 and the barrier layer 206, and only a portion in the trench 210 is occupied by the isolation oxide 214 and an empty space 210D of the trench 210 remains.

At operation 314, a spin coating material 216 is deposited on the isolation oxide 214 to fill the trench 210. The spin coating material 216 includes such as SOG, SOD, combinations thereof, or the like, and is formed by a spin coating process. In some embodiments, the spin coating material 216 is formed by performing such as a SOG process, a SOD process, a FCVD process, or another suitable process. Then, a curing process, such as a heat curing process, a UV curing process, or another suitable process, is performed to cure the spin coating material 216.

At operation 316, a portion of the isolation oxide 214 and a portion of the spin coating material 216 above a top surface of the barrier layer 206 are removed by a planarization process such as a CMP process, a grinding process, or another suitable process, in which the barrier layer 206 serves as a planarization stop layer for stopping a planarization process. After the planarization process, a portion of the isolation oxide 214 and a portion of the spin coating material 216 remain in the trench 210, and top surfaces of the barrier layer 206, the isolation oxide 214 and the spin coating material 216 are substantially coplanar to each other.

In accordance with some embodiments, the disclosure provides a semiconductor device. The semiconductor device includes a semiconductor substrate and a trench isolation. The trench isolation is formed in the semiconductor substrate. The trench isolation includes an isolation oxide and a spin coating material. The isolation oxide is peripherally enclosed by the semiconductor substrate. The spin coating material is peripherally enclosed by the isolation oxide.

In accordance with some embodiments, the disclosure provides a method of forming a semiconductor device. In this method, a semiconductor substrate is provided. A barrier layer is formed over the pad layer. A trench is formed by etching through the barrier layer and a portion of the semiconductor substrate. An isolation oxide partially fills the trench, and a spin coating material fills a remaining portion of the trench.

In accordance with some embodiments, the disclosure provides a method of forming a semiconductor device. In this method, a semiconductor substrate is provided. A pad layer is formed over the semiconductor substrate. A barrier layer is formed over the pad layer. A trench is formed by etching through the pad layer, the barrier layer and a portion of the semiconductor substrate. An isolation oxide partially fills the trench, and a spin coating material fills a remaining portion of the trench. A planarization process is performed to remove a portion of the isolation oxide and a portion of the spin coating material above a top surface of the barrier layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of fabricating a semiconductor device, the method comprising:
   providing a semiconductor substrate;
   forming a barrier layer over the semiconductor substrate;
   forming a trench by etching through the barrier layer and a portion of the semiconductor substrate;
   partially filling the trench with an isolation oxide, wherein the remaining portion of the trench comprises an opening and an empty space below the opening, and an overhang is formed at a top portion of the trench after the isolation oxide is formed partially filling the trench to shrink the opening; and
   filling the remaining portion of the trench with a spin coating material.

2. The method of claim 1, wherein the operation of filling the remaining portion of the trench comprises using a spin on glass (SOG) process or a spin on dielectric (SOD) process and a curing process to fill the spin coating material in the remaining portion of the trench.

3. The method of claim 2, wherein the curing process is a heat curing process or an ultra-violet (UV) curing process.

4. The method of claim 1, further comprising:
performing a planarization process to remove a portion of the isolation oxide and a portion of the spin coating material positioned above a top surface of the barrier layer.

5. The method of claim 4, wherein the planarization process is a chemical mechanical polishing (CMP) process.

6. The method of claim 4, wherein top surfaces of the barrier layer, the isolation oxide and the spin coating material are substantially coplanar to each other after the planarization process is performed.

7. The method of claim 1, wherein the operation of partially filling the trench with the isolation oxide comprises depositing the isolation oxide in the trench using a high-density plasma (HDP) chemical vapor deposition (CVD) process.

8. The method of claim 1, further comprising:
forming a liner layer along a sidewall and a floor of the trench.

9. The method of claim 1, wherein the barrier layer is a planarization stop layer for stopping the planarization process.

10. The method of claim 1, wherein the spin coating material is formed comprising SOG, SOD or resin.

11. A method of fabricating a semiconductor device, the method comprising:
providing a semiconductor substrate;
forming a pad layer over the semiconductor substrate;
forming a barrier layer over the pad layer;
forming a trench by etching through the barrier layer, the pad layer and a portion of the semiconductor substrate;
partially filling the trench with an isolation oxide, wherein the remaining portion of the trench comprises an opening and an empty space below the opening, and an overhang is formed at a top portion of the trench after the isolation oxide is formed partially filling the trench to shrink the opening;
filling the remaining portion of the trench with a spin coating material; and
performing a planarization process to remove a portion of the isolation oxide and a portion of the spin coating material positioned above a top surface of the barrier layer.

12. The method of claim 11, wherein top surfaces of the barrier layer, the isolation oxide and the spin coating material are substantially coplanar to each other after the planarization process is performed.

13. The method of claim 11, wherein the operation of filling the remaining portion of the trench comprises using a SOG process or a SOD process and a curing process to fill the spin coating material in the remaining portion of the trench.

14. The method of claim 13, wherein the curing process is a heat curing process or an ultra-violet (UV) curing process.

15. The method of claim 11, wherein the planarization process is a CMP process.

16. The method of claim 11, wherein the operation of partially filling the trench with the isolation oxide comprises depositing the isolation oxide in the trench using a HDP CVD process.

17. The method of claim 11, further comprising:
forming a liner layer along a sidewall and a floor of the trench.

18. The method of claim 11, wherein the barrier layer is a planarization stop layer for stopping the planarization process.

\* \* \* \* \*